United States Patent [19]

Mueller

[11] Patent Number: 5,055,842
[45] Date of Patent: Oct. 8, 1991

[54] MULTI-STAGE SERIAL-TO-PARALLEL/PARALLEL-TO-SERIAL CONVERTER PROCESSING DATA WORDS BY SEGMENTS

[75] Inventor: Rudi Mueller, Groebenzell, Fed. Rep. of Germany

[73] Assignee: Siemens Aktiengesellschaft, Munich, Fed. Rep. of Germany

[21] Appl. No.: 600,855

[22] Filed: Oct. 22, 1990

[30] Foreign Application Priority Data

Oct. 23, 1989 [EP] European Pat. Off. ......... 89119646.1

[51] Int. Cl.$^5$ ............................................. H03M 9/00
[52] U.S. Cl. .................................... 341/100; 341/101; 377/76
[58] Field of Search .............................. 341/100, 101; 365/189.05, 219, 238.5; 377/46, 75, 76, 77, 126

[56] References Cited

U.S. PATENT DOCUMENTS

| | | | |
|---|---|---|---|
| 4,003,083 | 1/1977 | Gariazzo | 341/100 X |
| 4,274,085 | 1/1981 | Marino, Jr. | 341/101 |
| 4,369,504 | 1/1983 | Hanmura | 365/219 |
| 4,620,180 | 10/1986 | Carlton | 341/100 |
| 4,799,040 | 1/1989 | Yanagi | 341/101 |
| 4,901,076 | 2/1990 | Askin et al. | 341/100 |

FOREIGN PATENT DOCUMENTS

| | | | |
|---|---|---|---|
| 0251151 | 6/1987 | European Pat. Off. | |
| 62-57322 | 3/1987 | Japan | 341/101 |
| 1-177221 | 7/1989 | Japan | 341/100 |
| 2-109425 | 4/1990 | Japan | 341/100 |

OTHER PUBLICATIONS

"FIFO Registers with more I/O Make Better System Glue", Electronic Design, 35, Feb. 19, 1987, No. 4, Hasbrouck Hts., NJ, p. 40.

"Memory Based CMOS FIFO Buffers Sport Large Capacities, Rival the Speed of Bipolars", Technology Update, Electrical Design News, 32, No. 6, Newton, MA, Mar. 18, 1987, pp. 65–72.

"Modulares Optisches Ubertragungssystem fur Datenraten bis 200 MBit/s", Karl Schrodinger, 37 Elektronik, Sep. 16, 1988, No. 19, Munich, W. Germany, pp. 63–67. Siemens Datenbuch Mikroprozessorbausteine, Edition 1976/77 (2 sheets).

Primary Examiner—Howard L. Williams
Attorney, Agent, or Firm—Hill, Van Santen, Steadman & Simpson

[57] ABSTRACT

A circuit for parallel-to-serial or serial-to-parallel conversion uses a multi-stage structure for conversion of long data words section-by-section. Each section of the data word corresponds to length/width of the respective registers or latches of the circuit which are successively controlled by an executive sequencer to process the data word in these smaller sections. The section-by-section conversion provides, for a high data rate, a reduction in clock loading and power dissipation.

10 Claims, 3 Drawing Sheets

MULTI-STAGE SERIAL-TO-PARALLEL/PARALLEL-TO-SERIAL CONVERTER PROCESSING DATA WORDS BY SEGMENTS

BACKGROUND OF THE INVENTION

Whereas the processing of binary data in digital data terminal equipment usually occurs in parallel data structure, the serial data structure is preferred for the transmission of binary data between data terminal equipment such as can be established, for example, by a connection between data terminal equipment of a LAN (local area network).

A module for serial-to-parallel-to-serial conversion of digital data words is known in the prior art (for example, European reference EP-A1 0 251 151) that is programmable such that data words that are shorter than the length of the built-in register for serial-to-parallel conversion can also be converted. For converting data words that are longer than the length of the register of serial-to-parallel conversion built into the module, an appropriate number of such modules are cascaded. Regardless of the data word length to be converted, however, the entire length of the respective data word is always read into or, respectively, read out from the register for serial-to-parallel conversion in parallel.

With increasing word length, there is a disadvantageous effect that the high number of simultaneously occurring switchings during a clock step leads to high loading peaks of the supplying operating voltage source and, thus, to high clock loads.

For bi-directional conversion of data words having a parallel structure into data words having a serial structure, the reference SIEMENS-Datenbuch Mikroprozessorbausteine, Edition 1976/77 discloses a module SAB 8251 that has function blocks that are connected by an internal data bus and control lines. The function blocks include a serial-to-parallel converter, a parallel-to-serial converter, a register for buffering data present in parallel structure and various controls. In this module, data words are always converted in their entire data word length, a length of 8 bits in the given case. When this concept is applied to the conversion of long data words as can be established, for example, by data words having a length of 512 bits, then high clock loads also occur for this module.

When the data rate is high in addition to the length of the data words to be processed, than a correspondingly high dissipated power also occurs for the known modules. Furthermore, given serial-to-parallel conversion and high data rates, it is difficult to continuously transfer serial data entering a register into the long shift register or, respectively, it is difficult to load the entire shift register in the parallel-to-serial conversion since less than 1 bit time is available for this event.

SUMMARY OF THE INVENTION

An object of the present invention is to provide a circuit arrangement for converting long data words of data words having a parallel structure into data words having a serial structure and/or vice-versa, the circuit arrangement not having the above-recited disadvantages.

The present invention is directed to a circuit arrangement for converting data words present in parallel structure into data words present in serial structure and/or vice-versa upon utilization of a shift register having a serial connection and a parallel connection, a data bus that connects the parallel connection to a plurality of registers, a plurality of control lines and an executive sequencer in which the data word to be converted is divided into section by the executive sequencer, these sections being, first, smaller than the data word length and, second, corresponding to the bit length of the shift register, whereby these data word section are successively converted in the shift register. The present invention produces the advantage that the outlay for the shift register in which the actual serial-to-parallel or, respectively, parallel-to-serial conversion occurs need be exerted only for a fraction of the overall data word length, whereby a high data rate is also easier to handle. Also, as a result of the division into a small circuit section having high processing speed and into a circuit section that is large in comparison thereto and that has slow processing speed, the clock loads and the dissipated power have considerably reduced values.

In a further development of the present invention, the signals for controlling the registers can be transmitted in a binary code format to the registers and decoded there. This measure produces the advantage of reducing the required plurality of control lines.

In accordance with another embodiment of the present invention, the registers are successively driven in that a register enable signal is shifted by register-associated control shift register stages that control the respective registers. This measure produces a considerable reduction in the number of control lines controlling the registers.

In a further development of the present invention, the first control shift register stage is supplied with the register enable signal at the beginning of a data word conversion. This measure assures the proper initial condition of the control shift register formed with the control shift register stages at the beginning of a data word conversion.

In a further development of the present invention, the control shift register stages form a shift register closed in a ring. This measure avoids the repeated setting of the register enable signal at the beginning of every data word conversion.

In a further development of the present invention, the control shift register stages are each respectively formed with a series circuit of a first transmission gate, a first inverter, a second transmission gate and a second inverter, whereby the second transmission gate is controlled with control signals that are complementary in comparison to the control signals supplied to the first transmission gate. This arrangement forms an especially low-outlay embodiment of the control shift register stages.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
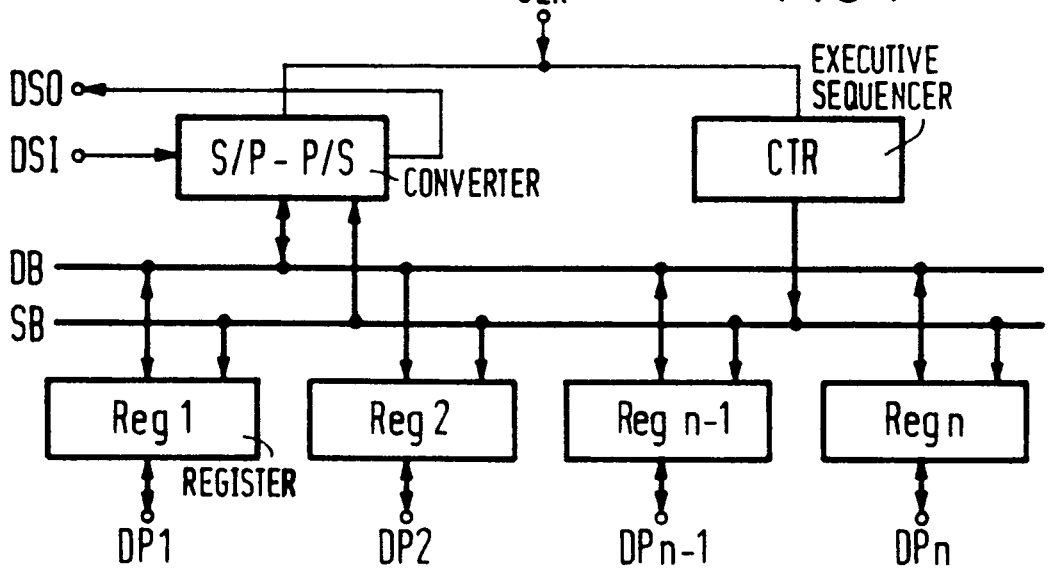
FIG. 1 is a block diagram of a serial-to-parallel-parallel-to-serial converter of the present invention.

A circuit arrangement for bi-directional serial-to-parallel-parallel-to-serial conversion of long data words is depicted in FIG. 1 to an extent necessary for an understanding of the present invention. A serial-to-parallel-parallel-to-serial converter S/P-P/S is formed with a shift register that has; a bit length that corresponds to a fraction of the data word length to be converted, a serial input DSI and/or a serial output DSO, a control input via which the shift register receives a clock signal CLK, a control input via which the output of the respective shift register content onto a data bus DB connected to the shift register is affected and a control input via which the transfer of the respective information pending on the data bus DB into the shift register is affected. Particularly when a data stream that has a data rate in the upper range of currently processable data rate is to be converted, this serial-to-parallel-parallel-to-serial converter S/P-P/S can, for example, be formed with a shift register constructed in ECL (emitter coupled logic) technology. A plurality of registers Reg1 ... Regn is connected to the data bus DB, for example, by commercially available CMOS modules having the designation 4034 each of which respectively has the same bit length as the S/P-P/S converter. The number of registers Reg1 ... Regn that each respectively have two bi-directional data terminals results from the bit length of the data words to be processed. For a register length of 8 bits, 64 registers Reg1 ... Regn are required for a data word length of, for example, 512 bits to be processed. An executive sequencer CTR that, just like the S/P-P/S converter, receives a clock signal CLK from a clock source (not shown in detail) is connected via a control bus SB to the registers Reg1 ... Regn and to the S/P-P/S converter.

The conversion of a long data word that is present in serial structure into a data word in parallel structure will be considered first.

Proceeding from an initial condition present at the beginning of the data word conversion, the executive sequencer CTR counts the clock steps CLK during which the serial data are read into the S/P-P/S converter via a serial data terminal DSI until a value is reached that corresponds to the length of the S/P-P/S converter (for example, 8 bits). Thereupon, the sequencer CTR, via the control bus SB, effects the parallel output of the data word section from the S/P-P/S converter onto the data bus DB that has a plurality of data lines corresponding to the bit length of the S/P-P/S converter and effects the transfer of this data word section into a first register Reg1. In the following cycles, the serial data entering into the S/P-P/S converter are respectively transferred into the next, following register Reg as set forth above until, finally, the entire data word is held in the registers Reg1 ... Regn and can be output onto the parallel data terminals DP1 ... Dpn for further processing.

The conversion of data words present in parallel structure into a serial data stream inventively sequences in the following manner.

The data word pending at the parallel data terminals DP1 ... Dpn that each respectively have a plurality of data lines corresponding to the register length is first transferred into the registers Reg1 ... Regn. Proceeding from an initial condition prevailing at the beginning of the conversion of a data word, the executive sequencer CTR, beginning at the register Reg1, controls the sequential transfer of the data from the registers Reg1 ... Regn via the data bus DB into the S/P-P/S converter. From the converter the data are output bit-by-bit onto a serial data terminal DSO with the clock CLK, controlling this with a clock that is reduced in comparison to the clock signal CLK by a factor that corresponds to the bit length of the S/P-P/S converter (for example, a factor of 8). It may be seen from this description that only a fraction of the entire data word length to be converted can be processed with the fast clock signal CLK. It is to be understood that intermediate registers, that are not shown here, in detail must be provided in the case of a serial-to-parallel conversion wherein a continuous data stream is to be processed or in the case of a parallel-to-serial conversion wherein the further-processing of the data pending in parallel structure is not assured within a time span that corresponds to the serial transmission duration of a plurality of bits corresponding to the bit length of the S/P-P/S converter. These intermediate registers, whose realization is within the capability of a person having average skill in the art, assure that the data are timely transferred in the case of the serial-to-parallel conversion or, respectively, assure that the data re timely provided in the case of the parallel-to-serial conversion.

A respective plurality of control lines corresponding in number to the plurality of registers (for example, 64 registers) that connect the executive sequencer CTR to the individual registers Reg1 ... Regn can be provided in a control bus SB for the individual drive of the registers Reg1 ... Regn for the parallel-to-serial conversion or, respectively, the serial-to-parallel conversion.

Figure 2:
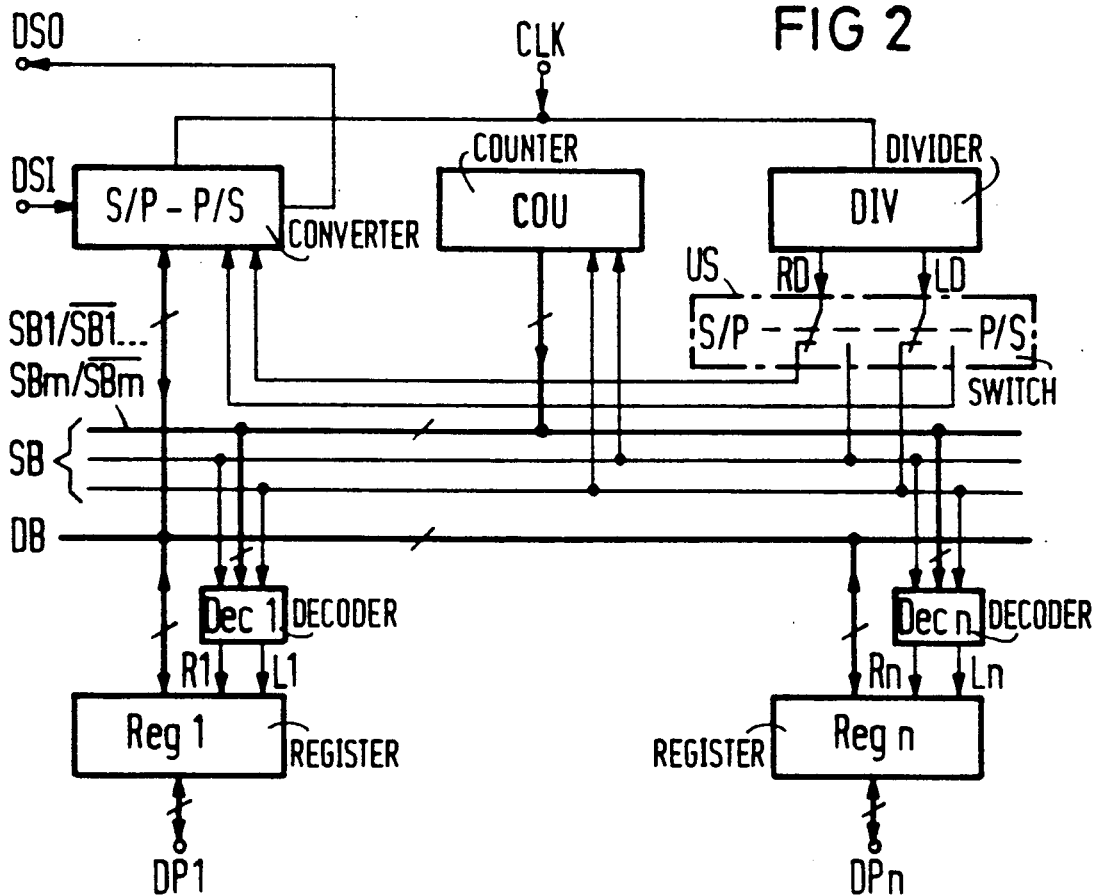
FIG. 2 is a block diagram depicting details of one embodiment of the present invention.

The plurality of control lines contained in the control bus SB can be reduced when, in accordance with FIG. 2, the control signals for driving the registers Reg1 ... Regn are transmitted with a binary code from a central controller to register-associated decoders Dec1 ... Decn. According to FIG. 2, the central controller contains a divider DIV and a counter COU. The divider DIV that steps the clock signal CLK down in a ratio that corresponds to the bit length of the serial-to-parallel-parallel-to-serial converter (for example, by the factor 8) can, for example, be formed with a shift register closed in a ring that is composed of a plurality of shift register stages corresponding in number to the length of the S/P-P/S converter. This shift register shifts a logical HIGH (or LOW) signal through clocked with the clock signal CLK proceeding from a basic condition prevailing before the conversion of the data word. Two inputs RD and LD of a switch-over means US preferably executed by electronic means are connected to two shift register stages.

In the switch position S/P of the switch-over means US depicted in FIG. 2, the signal appearing at the switch-over input RD in the case of a serial-to-parallel conversion is first output to the serial-to-parallel-parallel-to-serial converter where it causes the memory content of the serial-to-parallel-parallel-to-serial converter to be output onto the data bus DB. Subsequently, the signal appearing at the switch-over input LD is first supplied to all decoders Dec1 ... Decn and, is used as a clock signal for the counter COU. Proceeding from a basic condition present at the beginning of the data word conversion, the counter COU counts up to a counter reading that corresponds to the plurality n of registers Reg1 . . . Regn and that supplies the respectively current counter reading to the decoders Dec1 . . . Decn in binarily coded fashion. This is supplied via the control bus SB formed with control lines SB1 . . . SBm and with control lines SB1 . . . SBm that carry the inverted signal in comparison to these control lines SB1 . . . SBm. When a decoder Dec1 . . . Decn recognizes the respective register-associated code on the control bus SB and when the LD signal simultaneously appears, then a signal for transferring the data pending on the data bus DB into the respective register Reg is output on the respective line L1 . . . Ln.

In the case of a parallel-to-serial conversion, the RD signal is supplied to all decoders Dec1 . . . Decn and also it serves as a clock signal for the counter COU that again supplies the current counter reading to the decoders Dec1 . . . Decn via the control bus SB. When the respective register-associated code and the RD signal appear simultaneously at a decoder Dec1 . . . Decn, the latter outputs a signal R1 . . . Rn for outputting the register content of the appertaining register Reg1 . . . Regn onto the data bus DB. With the LD signal, the serial-to-parallel-parallel-to-serial converter accepts the data pending on the data bus DB and subsequently shifts them out via the serial data terminal DSO clocked with the clock signal CLK.

Figure 3:
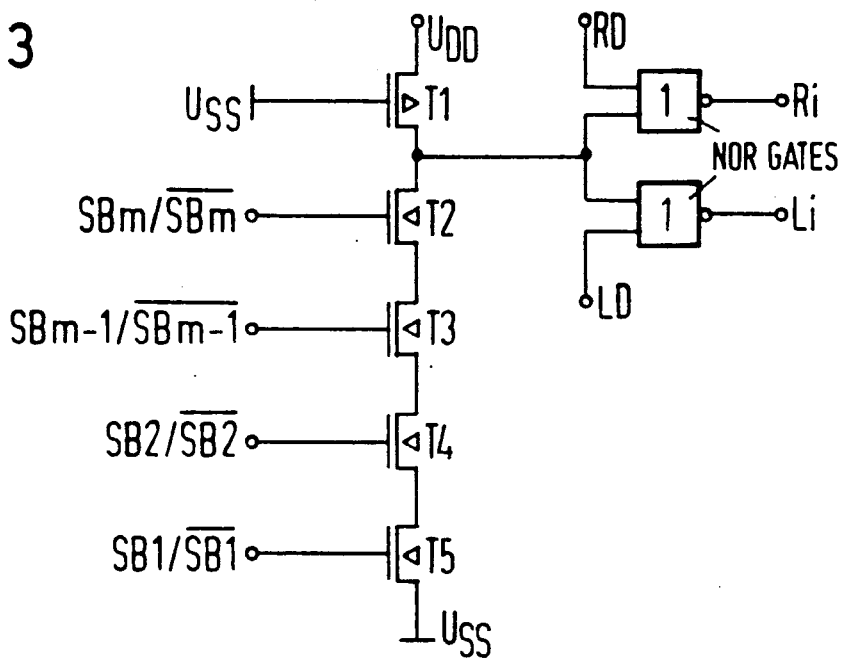
FIG. 3 is a circuit-oriented realization of details corresponding to the FIG. 2 diagram.

FIG. 3 shows how the decoders Dec1 . . . Decn can be realized in terms of circuit elements. The decoders Dec1 . . . Decn are each respectively formed by a series circuit of a plurality of transistors (T1, T5), whereby the outer transistors T1, T5 have one of their main electrodes connected to a terminal $U_{DD}$, $U_{SS}$ of an operating voltage source $U_{DD}$-$U_{SS}$. The one transistor T1 that has its main electrode connected to the high potential terminal $U_{DD}$ of the operating voltage source $U_{33}$-$U_{SS}$ is preferably a self-inhibiting field effect transistor of the p-channel type that has its control electrode connected to the low potential terminal $U_{SS}$ of the operating voltage source $U_{DD}$-$U_{SS}$ and that thus acts like a load resistor. The remaining transistors T2, T3, T4 of the series circuit are preferably of the self-inhibiting n-channel type and respectively have their control electrodes connected to a control line SB1 . . . Sbm or to a control line SB1 . . . Sbm that carries the inverted signal in comparison to the respective control line SB1 . . . Sbm.

When all n-channel transistors of the series circuit have their control electrodes receiving a HIGH signal, then a change in signal status (in the example, from HIGH to LOW) occurs at the junction of the main electrode of the p-channel transistor with the main electrode of the neighboring n-channel transistor, this change in signal status leading via a connection to respectively one input of two gates that realize the logical NOR function. So that this change in signal status occurs exactly when a binary counter reading of the counter COU there corresponds to the respective register-associated code is reached, the respective control electrodes of the respective n-channel transistors are connected to a control line SB1 . . . Sbm having a significance of the binary code or to a complementary control line Sb1 . . . Sbm that carries the inverse signal, this carrying an HIGH signal exactly when the respective register-associated code is present. The signal output by the series circuit to the NOR gates is respectively operated with an RD signal or, respectively, LD signal that indicates the active condition in the LOW condition. In the case of the serial-to-parallel conversion, the respective output signal L1 . . . Ln (in the example, HIGH-active) of the respective NOR gate effects the transfer of the information pending on the data bus DB in the respective register Reg1 . . . Regn, in contrast whereto the output signal R1 . . . Rn (in the example, HIGH-active) of the respective NOR gate in the case of the serial-to-parallel conversion effects the output of the register content contained in the respective register Reg1 . . . Regn onto the data bus DB.

The series circuit formed by the transistors and realizing the logical NAND function need not satisfy any special demands made of the switching speed when the signal changes at the control electrodes of the n-channel transistors of the series circuit ensue in such timely fashion that the signal at the junction of the p-channel transistor with the neighboring n-channel transistor has assumed a stable condition when the LD signal or, respectively, the RD signal appears.

Figure 4:
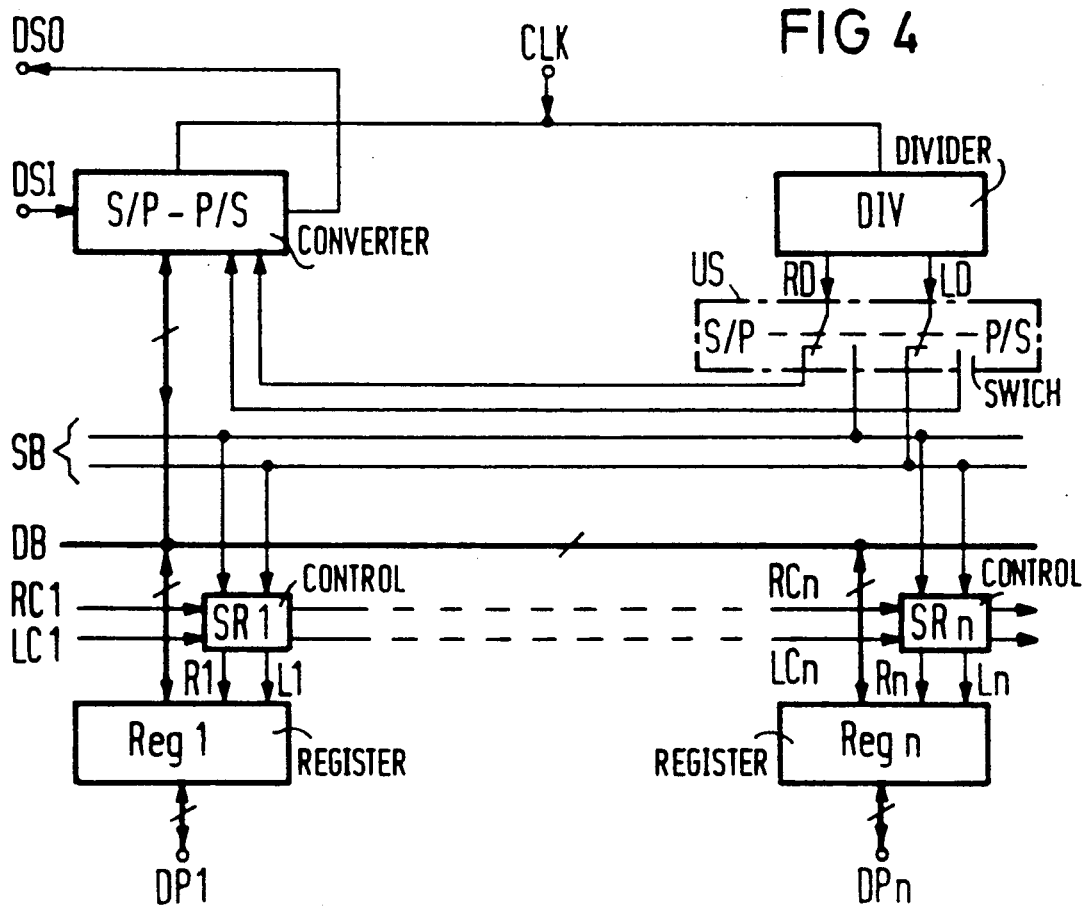
FIG. 4 is a block diagram depicting details of another embodiment of the present invention.

FIG. 4 shows an alternative to the above-described drive of the registers Reg1 . . . Regn. The S/P-P/S converter that accepts only a fraction of the overall data word length is again connected via a data bus DB to all registers Reg1 . . . Regn and, just like a divider DIV, is supplied with a clock signal CLK. The divider DIV that can be again formed with a shift register, divides the clock signal CLK by a factor corresponding to the length of the S/P-P/S converter and provides the RD signal and the LD signal. In this exemplary embodiment, the control of the registers Reg1 . . . Regn ensues with a control shifter register each of whose control shift register stages SR1 . . . Sn is respectively allocated to a register Reg1 . . . Regn.

In the case of a serial-to-parallel conversion and given the switch position S/P of the switch-over means US depicted in FIG. 4, the RD signal appearing at the switch-over input RD is first output to the serial-to-parallel-parallel-to-serial converter where it effects the output of the memory contents of the serial-to-parallel-parallel-to-serial converter onto the data bus DB. Subsequently, the LD signal appearing at the switch-over input LD is supplied to all shift register stages SR1 . . . SRn. A register enable signal (for example, an HIGH register enable signal) that identifies the active condition and pends at the input LC1 of the shift register stage SR1 at the beginning of the serial-to-parallel conversion of a data word causes a signal L1- given simultaneous appearance of the LD signal, for transferring the signals situated on the data bus DB into the register Reg1. The respective signal pending at the input LC1 . . . LCn of the respective shift register stages SR1 . . . SRn is shifted with the LD signal as a clock to the corresponding input of the next, following control shift register stage SR, so that the data word sections are successively transferred into the registers Reg1 . . . Regn with the LD signal and, finally, the entire, converted data word pends at the parallel data terminals DP1 . . . DPn.

In the case of a parallel-to-serial conversion, the RD signal is supplied to all register-associated control shift register stages SR1 . . . SRn via the switch-over US situated in the switch position P/S. The register enable signal (for example, an HIGH register enable signal) that identifies the active condition at the input RC1 of the control shift register stage SR1 at the beginning of the parallel-to-serial conversion of a data word, given simultaneous appearance of the RD signal, causes a signal R1 for outputting the data word section of the register Reg1 onto the data bus DB. The serial-to-parallel-parallel-to-serial converter accepts this data word section with the LD signal and reads it out at the serial data output DSO with the clock signal CLK. The respective signal pending at the input RC1 ... RCn of the respective shift register stage SR1 ... SRn is shifted to the corresponding input RC of the next, following shift register stage with the RD signal as a clock, so that the data word section of the next, following register Reg is respectively converted at the appearance of the next RD signal and, finally, the data word to be converted appears with its entire length in serial structure at the serial data terminal DSO.

At the beginning of the above-described data word conversion of the present invention according to FIG. 4, the respective input RC1 or, respectively, LC1 of the control shift register stage SR1 is again charged with a register enable signal that identifies the active condition. Alternatively however, the respective input RC1 or LC1 of the control shift register stage SR1 can also be connected to the respective corresponding output of the control shift register stage SRn, so that the register enable signal is shifted in a ring.

The shift register stages SR1 ... SRn can be formed in a known way with a respective flip-flop, whereby the output signal of the respective flip-flop, on the one hand, forms the input signal for the next following flip-flop, and, on the other hand, forms the respective R1 ... Rn signal by operation with the RD signal simultaneously acting as a clock signal or, respectively, forms the respective L1 ... Ln control signal after operation with the LD signal simultaneously acting as a clock signal.

Figure 5:
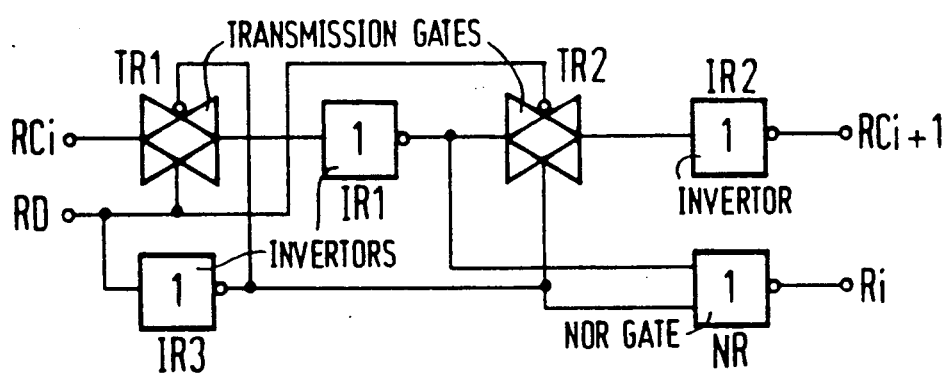
FIG. 5 is a circuit-oriented realization of details corresponding to the FIG. 4 diagram.
Figure 5:
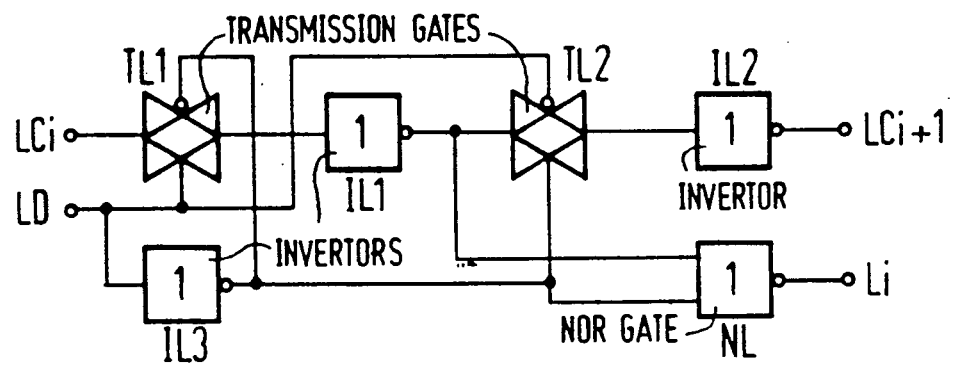

As shown in FIG. 5, however, the control shift register stages SR1 ... SRn can also be formed with dynamic shift register stages, whereby a respectively identical circuit structure is used for the serial-to-parallel conversion and for the parallel-to-serial conversion. It is therefore sufficient to describe the control shift register structure for the parallel-to-serial conversion. A control shift register stage SR for the parallel-to-serial conversion is respectively formed with the series circuit of a transmission gate TR1, an inverter IR1, a further transmission gate TR2 and a further inverter IR2, whereby the transmission gates TR1, TR2 are driven oppositely with the RD signal and the inverted RD signal which is provided by an inverter IR3. The output signal of the inverter IR1 and the inverted RD signal are received by a gate NR that performs a logical NOR operation, so that the respective Ri control signal is available at the output thereof.

In the embodiment of the control shift register stages SR1 ... SRn corresponding to FIG. 5, the dynamic memory effect is exploited, this appearing at the inputs of the inverters IR1, IR2 following the respective transmission gates and effecting that the input signal of the inverters is preserved for a certain time span after the preceding transmission gate becomes a high-impedance.

Due to a corresponding RD signal (in the example, an HIGH signal), the transmission gate TR1 is switched to a high-impedance, wherewith the register enable signal (for example, an HIGH register enable signal) at the input RCi proceeds inverted by the inverter IR1 to the input of the transmission gate TR2 that is switched to a high-impedance given the existence of these control signals and proceeds to an input of the NOR gate NR.

In the given case, the RD signal inverted in the inverter IR3 inhibits the transmission gate TR2 and simultaneously is received at the input side of the NOR gate NR, as a consequence whereof the latter outputs an Ri control signal to the appertaining register Reg at its output in the given case. Due to a signal change of the RD signal (in the example, to LOW), the transmission gate TR1 becomes high-impedance, whereas the transmission gate TR2 becomes low-impedance. After the respective transmission gate TR1, TR2 that precedes the respective inverter IR1, IR2 has become high-impedance, the previous input condition is preserved for a certain time span at the inputs of the inverters IR1, IR2 as a result of the parasitic input capacitance. As a result thereof, an LOW signal continues to pend at the output of the inverter IR1 in the above-described case. It proceeds via the low-impedance transmission gate TR2 to the input of the inverter IR2 and, at the output thereof, proceeds as a HIGH signal to the input of the following control shift register stage SR. The control shift register stage SR for the serial-to-parallel conversion (TL1, IL1, TL2, IL2, IL3, NL) operates in fundamentally the same way and therefore need not be set forth in greater detail here.

The control of the registers Reg1 ... Regn with the respectively same, register-associated control shift register stages SR1 ... SRn yields the advantage of a considerable reduction of the control lines that are required and of a simple, module expandability.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. Circuit arrangement for at least one of converting data words having a parallel structure into data words having a serial structure or converting data words having a serial structure into data words having a parallel structure, comprising: a shift register converter having at least serial terminals and having a length less than a length of a data word to be converted, a data bus that connects parallel terminals via a plurality of registers to the serial terminals via the shift register converter, a plurality of control lines connecting an executive sequencer to the shift register converter and to the plurality of registers, the data word to be converted being divided into sections by the executive sequencer, these sections being, first, smaller than the data word length, and, second, corresponding to the length of the shift register converter, whereby these data word sections are successively converted in the shift register converter.

2. Circuit arrangement according to claim 1, wherein the plurality of registers are successively driven in that a register enable signal is shifted through register-associated control shift register stages that control the respective plurality of registers.

3. Circuit arrangement according to claim 2, wherein a first control shift register stage is supplied with the register enable signal at the beginning of a data word conversion.

4. Circuit arrangement according to claim 3, wherein the control shift register stages form a shift register closed in a ring.

5. Circuit arrangement according to claim 3, wherein the control shift register stages are each respectively formed by at least a series circuit of a first transmission gate, a first inverter, a second transmission gate, and a second inverter, whereby the second transmission gate is controlled with control signals that are complementary with respect to the control signal supplied to the first transmission gate.

6. A circuit arrangement for at least one of converting data words having a parallel structure into data words having a serial structure or converting data words having a serial structure into data words having a parallel structure, comprising: a shift register converter having at least serial terminals, a data bus that connects parallel terminals via a plurality of registers to the serial terminals via the shift register converter, a plurality of control lines connecting an executive sequencer to the shift register converter and to the plurality of registers, the data word to be converted being divided into sections by the executive sequencer, these sections being, first, smaller than the data word length, and, second, corresponding to the length of the shift register converter, whereby these data word sections are successively converted in the shift register converter, signals for controlling the plurality of registers being transmitted in a binary code from the executive sequence to the plurality of registers wherein the signals are decoded.

7. Circuit arrangement according to claim 6, wherein the plurality of registers are successively driven in that a register enable signal is shifted through register-associated control shift register stages that control the respective plurality of registers.

8. Circuit arrangement according to claim 7, wherein a first control shift register stage is supplied with the register enable signal at the beginning of a data word conversion.

9. Circuit arrangement according to claim 8, wherein the control shift register stages form a shift register closed in a ring.

10. Circuit arrangement according to claim 8, wherein the control shift register stages are each respectively formed by at least a series circuit of a first transmission gate, a first inverter, a second transmission gate, and a second inverter, whereby the second transmission gate is controlled with control signals that are complementary with respect to the control signal supplied to the first transmission gate.

* * * * *